(12) United States Patent
Fowler et al.

(10) Patent No.: US 9,072,199 B2
(45) Date of Patent: Jun. 30, 2015

(54) THERMAL TRANSFER COMPONENT, APPARATUS AND METHOD INCLUDING THERMALLY CONDUCTIVE FRAME PENETRATED BY THERMALLY CONDUCTIVE PLUG

(75) Inventors: Michael Lee Fowler, Minoa, NY (US); Andrew Jonathan Brindle, Clay, NY (US)

(73) Assignee: SRC, Inc., North Syracuse, NY (US)

( * ) Notice: Subject to any disclaimer, the term of this patent is extended or adjusted under 35 U.S.C. 154(b) by 637 days.

(21) Appl. No.: 12/979,014

(22) Filed: Dec. 27, 2010

(65) Prior Publication Data
US 2012/0160449 A1 Jun. 28, 2012

(51) Int. Cl.
*F28F 7/00* (2006.01)
*H05K 7/20* (2006.01)

(52) U.S. Cl.
CPC .................................. *H05K 7/20509* (2013.01)

(58) Field of Classification Search
CPC ............ F28D 2021/0028; H01L 23/36; H01L 23/3733; H01L 23/40; H01L 23/4093; H05K 7/2037
USPC ................ 165/185, 80.2, 80.3; 361/702, 704; 257/719
See application file for complete search history.

(56) References Cited

U.S. PATENT DOCUMENTS

| | | | |
|---|---|---|---|
| 4,712,159 A | * | 12/1987 | Clemens ........................ 361/717 |
| 5,224,030 A | | 6/1993 | Banks et al. |
| 5,523,260 A | | 6/1996 | Missele |
| 5,949,650 A | | 9/1999 | Bulante et al. |
| 6,093,961 A | | 7/2000 | McCullough |
| 6,191,478 B1 | | 2/2001 | Chen |
| 6,252,774 B1 | * | 6/2001 | Rife ............................... 361/704 |

(Continued)

FOREIGN PATENT DOCUMENTS

WO 2005037734 4/2005

OTHER PUBLICATIONS

Van Den Brink et al.; "Conductive Cooling of SDD and SSD Front-End Chips for ALICE"; The ALICE Colaboration; published on the internet at http://cdsweb.cern.ch/record/521854/files/p368.pdf; 2001; 5 page document w/no page numbers.

(Continued)

*Primary Examiner* — Mohammad M Ali
*Assistant Examiner* — Erik Mendoza-Wilkenfel
(74) *Attorney, Agent, or Firm* — George R. McGuire; Frederick J. M. Price; Bond Schoeneck & King, PLLC (57) ABSTRACT

A thermal transfer component, a thermal transfer apparatus and a method for cooling a heat generating component located upon a substrate each include a thermally conductive frame having an aperture formed completely through the thermally conductive frame within which aperture is located a thermally conductive plug. The thermally conductive plug aligns with and contacts the heat generating component when the thermally conductive frame and the substrate are mutually aligned and assembled. A spring may further compress the thermally conductive plug against the heat generating component when the thermally conductive frame and the substrate are mutually aligned and assembled. The thermally conductive plug comprises an isotropic thermal transfer material and the thermally conductive frame comprises an anisotropic thermal conductive material to provide for enhanced thermal transfer from the heat generating component to a chassis.

26 Claims, 3 Drawing Sheets

(56) References Cited

U.S. PATENT DOCUMENTS

| | | | |
|---|---|---|---|
| 6,317,325 B1* | 11/2001 | Patel et al. | 361/704 |
| 6,430,052 B1* | 8/2002 | Kordes et al. | 361/719 |
| 6,459,582 B1* | 10/2002 | Ali et al. | 361/704 |
| 6,469,381 B1 | 10/2002 | Houle et al. | |
| 6,542,371 B1 | 4/2003 | Webb | |
| 6,713,863 B2 | 3/2004 | Murayama et al. | |
| 6,771,504 B2 | 8/2004 | Barcley | |
| 6,785,137 B2* | 8/2004 | Siegel | 361/704 |
| 6,839,235 B2 | 1/2005 | St. Louis et al. | |
| 6,882,537 B2 | 4/2005 | Barcley | |
| 6,965,163 B2 | 11/2005 | Chiu | |
| 6,992,891 B2* | 1/2006 | Mallik et al. | 361/704 |
| 7,133,287 B2 | 11/2006 | Campini et al. | |
| 7,202,558 B2 | 4/2007 | Kuramachi | |
| 7,251,138 B2 | 7/2007 | Hornung et al. | |
| 7,254,024 B2 | 8/2007 | Salmon | |
| 7,349,221 B2 | 3/2008 | Yurko | |
| 7,473,995 B2 | 1/2009 | Rumer et al. | |
| 7,483,271 B2 | 1/2009 | Miller et al. | |
| 2004/0217472 A1 | 11/2004 | Aisenbrey et al. | |
| 2004/0252462 A1* | 12/2004 | Cromwell et al. | 361/719 |
| 2005/0117296 A1* | 6/2005 | Wu et al. | 361/697 |
| 2005/0264999 A1* | 12/2005 | Kalyandurg | 361/704 |
| 2006/0060328 A1* | 3/2006 | Ewes et al. | 165/80.2 |
| 2006/0104035 A1 | 5/2006 | Vasoya et al. | |
| 2007/0199689 A1* | 8/2007 | Thoman et al. | 165/185 |
| 2007/0211445 A1* | 9/2007 | Robinson et al. | 361/818 |
| 2007/0297131 A1* | 12/2007 | Hood et al. | 361/687 |
| 2008/0259566 A1* | 10/2008 | Fried | 361/699 |
| 2008/0315401 A1 | 12/2008 | Imamura et al. | |
| 2009/0321048 A1* | 12/2009 | Liu et al. | 165/80.3 |
| 2011/0170265 A1* | 7/2011 | Lai et al. | 361/709 |
| 2011/0199734 A1* | 8/2011 | Nishida et al. | 361/720 |

OTHER PUBLICATIONS

Vasoya; "Key Benefits of the Carbon Fiber Composite in a Printed Circuit Board and a Substrate", Hunter Technology Corp.; NASA/JPL Science Forum, Aug. 2006; 30 page document.

Khan; "New Materials and Techniques Tackle PCB Thermal Management"; Nexlogic Technologies; http://rtcmagazine.com/articles/view/100944; Mar. 2008; 3 page document.

* cited by examiner

THERMAL TRANSFER COMPONENT, APPARATUS AND METHOD INCLUDING THERMALLY CONDUCTIVE FRAME PENETRATED BY THERMALLY CONDUCTIVE PLUG

BACKGROUND

1. Field of the Invention

The invention relates generally to thermal transfer apparatus for thermal transfer, such as heat generating component cooling, within electronics assemblies. More particularly, the invention relates to efficient thermal transfer apparatus for efficient thermal transfer, such as efficient heat generating component cooling, within electronics assemblies.

2. Description of the Related Art

As electronics technology has advanced, the density of electronics components located within and upon electronics substrates has typically increased in dramatic proportions. Such a substantial increase in electronics components density typically provides for a correlating increase in electronics product and electronics circuit functionality and performance.

Accompanying such increases in electronics product and electronics circuit functionality and performance is often the generation of much excess heat, which in turn may be quite substantial in certain types and designs of electronics components and electronics circuits. In order to provide for efficient operation of many types of electronics components and circuits, thermal transfer apparatus, such as heat sink apparatus, are thus often included. Such thermal transfer apparatus are intended to channel heat away from a heat producing component within a particular electronics product or assembly, and optionally dissipate the heat, thus allowing the particular heat generating component to operate absent any compromise in performance induced by overheating.

Various types and constructions of thermal transfer apparatus are known in the electronics components fabrication and assembly arts.

For example, Banks et al., in U.S. Pat. No. 5,224,030, teaches a thermal transfer apparatus that may include a graphite fiber composite material embedded within a highly conductive heat sink material, such as copper. This particular thermal transfer apparatus is efficient and light weight.

In addition, Bulante et al., in U.S. Pat. No. 5,949,650, teaches a heat sink circuit board structure that includes a carbon fiber composite core including carbon fibers aligned in a particular planar direction and carbon fiber composite cladding layers laminated thereto at opposite sides with carbon fibers aligned perpendicular to the particular direction. This particular heat sink circuit board structure possesses superior mechanical and thermal properties in comparison with related alternative heat sink circuit board structures.

Further, McCullough, in U.S. Pat. No. 6,093,961, teaches a molded heat sink assembly for attachment to an individual heat generating component, such as a semiconductor chip package, within an electronics assembly. This particular molded heat sink assembly includes integrally molded retainer clips for sidewall and top surface attachment of the molded heat sink assembly to the individual heat generating component, such as the semiconductor chip package.

Still further, Chen, in U.S. Pat. No. 6,191,478, teaches a heat spreader apparatus for a flip chip semiconductor component package. The heat spreader apparatus includes a frame that allows for sidewall attachment to both: (1) the flip chip semiconductor component package; and (2) a heat spreader that is located above the flip chip semiconductor component package and separated from the flip chip semiconductor component package by a flexible thermal interface material. Among other considerations, this particular heat spreader apparatus may be fabricated using low cost materials.

Finally, Vasoya, in *Key Benefits of the Carbon Fiber Composite in a Printed Circuit Board and a Substrate*, NASA/JPL Science Forum, August 2006, teaches a carbon fiber composite as a thermally conductive core material in printed circuit board fabrication and operation. A printed circuit board that uses the carbon fiber composite as the core material possesses superior thermal properties and mechanical properties absent an increase in weight.

Desirable are additional thermal transfer apparatus, such as heat sink apparatus, and methods for cooling heat generating components within electronic circuits and electronics assemblies while using the thermal transfer apparatus.

SUMMARY

The invention includes: (1) a particular thermal transfer component; (2) a particular thermal transfer apparatus that includes the particular thermal transfer component; and (3) a particular method for cooling a heat generating component located upon and assembled to a substrate while using the particular thermal transfer apparatus that includes the particular thermal transfer component.

The particular thermal transfer component, thermal transfer apparatus and related method in accordance with the invention utilize a thermally conductive frame having an aperture completely through the thermally conductive frame that corresponds with the location of the heat generating component located upon and assembled to the substrate when the thermally conductive frame and the substrate are mutually aligned and assembled into a circuit board chassis. A thermally conductive plug is located in the aperture and contacts the heat generating component. A spring may assist in compressing the thermally conductive plug against the heat generating component.

The thermally conductive frame preferably comprises a thermally conductive material that provides directional and anisotropic thermal transfer, such as but not limited to a thermally conductive carbon fiber composite material that provides directional and anisotropic thermal transfer. The thermally conductive plug comprises a thermally conductive material that provides non-directional and isotropic thermal transfer, such as but not limited to a thermally conductive metal material that provides non-directional and isotropic thermal transfer. Such thermally conductive metal materials may include, but are not necessarily limited to, copper, copper alloy, aluminum and aluminum alloy metal materials.

By fabricating the thermally conductive frame of such an anisotropically thermally conductive fiber material and fabricating the thermally conductive plug of such an isotropically thermally conductive metal material, the embodiments provide for thermal transfer from the heat generating component to the chassis that may be efficiently optimized.

A particular thermal transfer component in accordance with the invention includes a thermally conductive frame sized to fit a substrate, the thermally conductive frame including an aperture completely through the thermally conductive frame at a location of a heat generating component located upon the substrate when the thermally conductive frame and the substrate are mutually aligned and assembled. The particular thermal transfer component also includes a thermally conductive plug located in the aperture and contacting the heat generating component to provide a thermal connection between the thermally conductive frame and the heat generating component when the thermally conductive frame and the substrate are mutually aligned and assembled.

A particular thermal transfer apparatus in accordance with the invention includes a chassis sized to fit a substrate that includes a heat generating component. This particular thermal transfer apparatus also includes a thermally conductive frame also fitted to the chassis, the thermally conductive frame including an aperture completely through the thermally conductive frame at a location of the heat generating component when the thermally conductive frame and the substrate are mutually aligned and assembled to the chassis. This particular thermal transfer apparatus also includes a thermally conductive plug located in the aperture and contacting the heat generating component to provide a thermal connection between the thermally conductive frame and the heat generating component when the thermally conductive frame and the substrate are mutually aligned and assembled to the chassis.

A particular method for cooling a heat generating component in accordance with the invention includes assembling to a substrate that includes a heat generating component a thermal transfer component that includes: (1) a thermally conductive frame including an aperture completely through the thermally conductive frame at a location of the heat generating component; and (2) a thermally conductive plug located within the aperture and contacting the heat generating component. This particular method also includes powering the heat generating component to generate heat that is dissipated through the thermally conductive plug and the thermally conductive frame.

BRIEF DESCRIPTION OF THE DRAWINGS

The objects, features and advantages of the invention are understood within the context of the Detailed Description of the Embodiments, as set forth below. The Detailed Description of the Embodiments is understood within the context of the accompanying drawings, that form a material part of this disclosure, wherein.

DETAILED DESCRIPTION OF THE EMBODIMENTS

The embodiments, which include: (1) a thermal transfer component and a thermal transfer apparatus (that includes the thermal transfer component) applicable to thermal transfer from a heat generating component located upon a substrate; and (2) a method for cooling the heat generating component located upon the substrate while using the thermal transfer component and the thermal transfer apparatus (that includes the thermal transfer component), is understood within the context of the description set forth below. The description set forth below is understood within the context of the drawings described above. Since the drawings are intended for illustrative purposes, the drawings are not necessarily drawn to scale.

Figure 1:
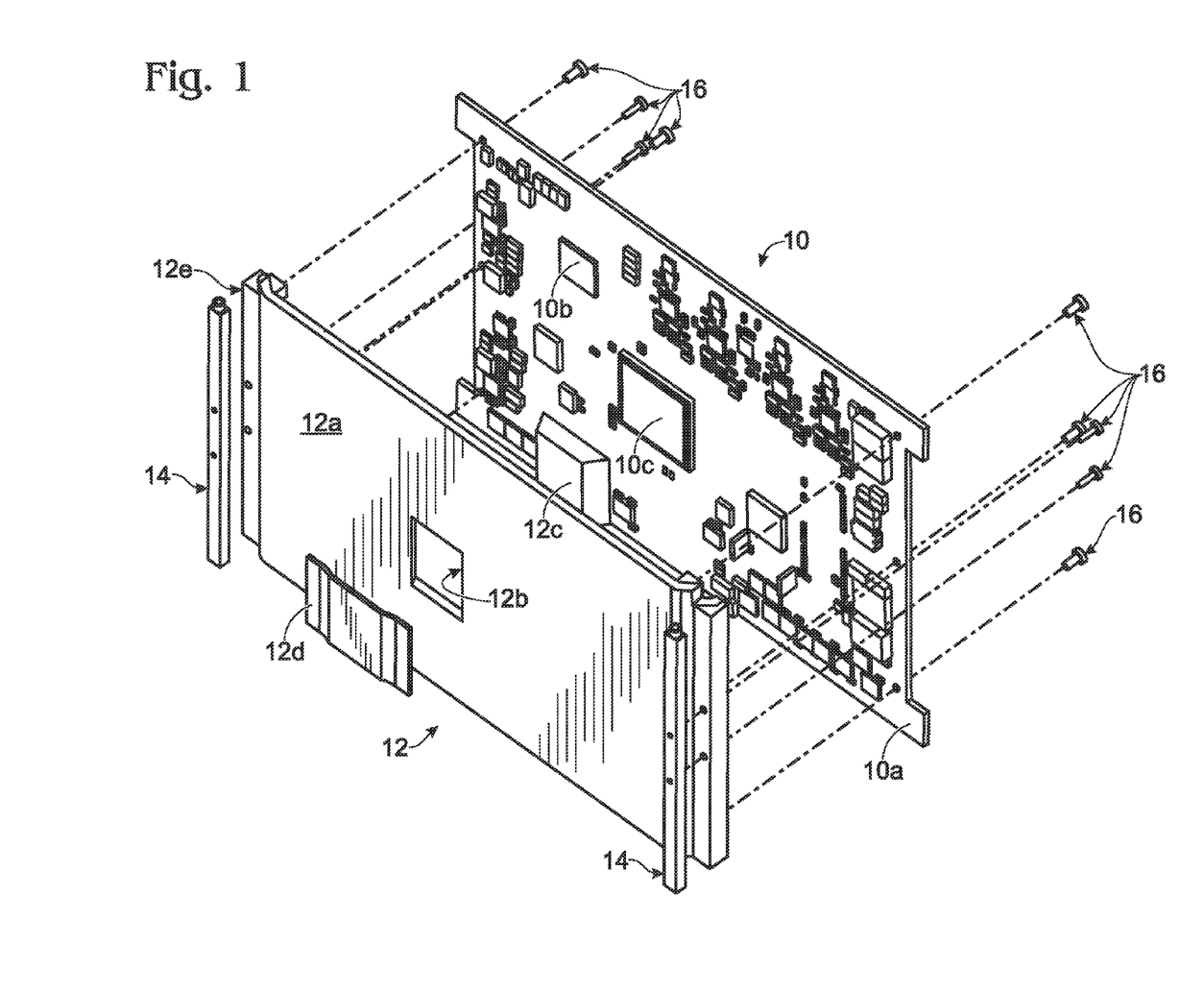
FIG. 1 shows a schematic perspective-view diagram (i.e., isometric-view diagram) of a circuit board including a heat generating component, the circuit board having exploded therefrom a thermal transfer component in accordance with a particular embodiment of the invention, the thermal transfer component further having exploded therefrom a plurality of wedge-lock assemblies.

FIG. 1 shows an exploded schematic perspective-view diagram including a circuit board 10 generally, from which is exploded a thermal transfer component 12 generally. In turn, a plurality of wedge-lock assemblies 14 is exploded from the thermal transfer component 12. As is illustrated within the schematic perspective-view diagram of FIG. 1, each of the circuit board 10, the thermally transfer component 12 and the wedge-lock assemblies 14 is intended to be assembled using a plurality of mechanical fasteners 16, such as but not limited to a plurality of screws.

As is illustrated within the exploded schematic perspective view diagram of FIG. 1, the circuit board 10 comprises a circuit board substrate 10a upon which is located and assembled a plurality of electronic components 10b. A particular electronic component within the plurality of electronic components 10b is intended as, and is designated as, a heat generating component 10c.

In addition, as is also illustrated within the exploded schematic perspective view diagram of FIG. 1, the thermal transfer component 12 comprises a thermally conductive frame 12a that includes an aperture 12b aligned with the heat generating component 10c located and assembled to the circuit board substrate 10a when the circuit board 10 and the thermal transfer component 12 are aligned and assembled. The thermal transfer component 12 also comprises a thermally conductive plug 12c that is intended to fit into the aperture 12b and contact the heat generating component 10c when the circuit board 10 and the thermal transfer component 12 are aligned and assembled. The thermally conductive plug 12c may be tensioned and compressed against the heat generating component 10c by means of a planar spring 12d. As well, the thermal transfer component 12 includes a plurality of thermally conductive spacers 12e that are intended to assure flat surfaces for contact of the plurality of wedge-lock assemblies 14 to the thermal transfer component 12 when assembling the circuit board 10, the thermal transfer component 12 and the wedge-lock assemblies 14 while using the fasteners 16.

Each of the foregoing components that comprise the circuit board 10, the thermal transfer component 12, the wedge-lock assemblies 14 and the fasteners 16 that are illustrated within the exploded schematic perspective-view diagram of FIG. 1 may comprise materials and be fabricated to dimensions that are otherwise generally conventional in the circuit board design, fabrication and assembly art.

For example, with respect to the circuit board 10, the circuit board substrate 10a may comprise any of several circuit board substrate types and circuit board substrate materials of construction that are generally conventional in the circuit board design, fabrication and assembly art. Such circuit board substrate types may include, but are not necessarily limited to high power circuit board substrates, medium power circuit board substrates and low power circuit board substrates. Also to be considered within the context of circuit board substrate types are circuit board substrates whose function is directed primarily to data manipulation, or alternatively directed primarily to data storage, or further alternatively directed to both data manipulation and data storage.

The circuit board substrate 10a is typically fabricated as a composite that will typically include reinforcing fibers within an organic polymer resin matrix. Separate layers of such a composite are interposed between layers of conductor metallization within the circuit board substrate 10a. Fiberglass reinforcing fibers and mats and related materials, as well as thermally conductive reinforcing fibers and mats and related materials, are common as reinforcing materials within the context of circuit board design, fabrication and assembly. As well, epoxy resins and other cross-linked resins are also common as thermosetting resins that may be used as an organic polymer resin matrix within the context of the circuit board substrate 10a. None of the foregoing materials choices however is intended to limit the embodiments within the context of a particular circuit board substrate type or circuit board substrate material of construction.

The electronics components 10b located upon and assembled to the circuit board substrate 10a may comprise any of several types of electronics components that are generally conventional in the circuit board design, fabrication and assembly art. Such electronics components may include, but are not necessarily limited to discrete electronics components, such as but not limited to resistors, transistors, diodes and capacitors. Such electronics components may also include, but are also not necessarily limited to circuit modules that may include, but are not necessarily limited to, multiple electronics components selected from the group including but not limited to resistors, transistors, diodes and capacitors.

The heat generating component 10c also typically comprises an electronics component such as any of the electronics components 10b that are described in greater detail above. However, the heat generating component 10c differs from the remainder of the electronics components 10b that are described above insofar as the heat generating component 10c generates a quantity of heat of magnitude that requires dissipation thereof in order to assure proper operation of the heat generating component 10c, as well as remaining circuits that are located upon the circuit board substrate 10a in general. While by no means limiting this particular embodiment, the heat generating component 10c may commonly comprise a microprocessor, or alternatively a circuit module that includes a microprocessor. Alternatively, the heat generating component 10c may also comprise a power switching component, such as but not limited to a power switching transistor.

In addition, with respect to the thermal transfer component 12, the thermally conductive frame 12a comprises a thermally conductive material. Such a thermally conductive material may most generally be selected from the group of thermally conductive materials including but not limited to thermally conductive metals and thermally conductive non-metals, such as in particular thermally conductive composites such as but not limited to thermally conductive fiber composites.

Although the instant embodiment does not necessarily limit the thermally conductive frame 12a to any particular thermally conductive material, the thermally conductive frame 12a typically comprises a thermally conductive fiber composite material having an anisotropic thermal conductivity that is enhanced in the direction of thermally conductive fiber length. Several thermally conductive fiber composite materials may have such anisotropic thermal conduction characteristics, including but not limited to various metal fibers, and some conjugated organic fiber materials, but anisotropically thermally conductive fiber composite materials based upon carbon fibers are particularly common and desirable. Typically and preferably, the thermally conductive frame 12a comprises carbon fibers in a cured organic polymer resin matrix to provide the thermally conductive frame 12a having a thickness from about 0.010 to about 0.500 inches and a carbon fiber loading from about 40% to about 90% by weight. Within the context of the instant embodiment, the carbon fibers within the thermally conductive frame 12a are arranged with longitudinal thermal conduction axes from generally from left to right (or right to left), but may aligned at angles from 0 to 90 degrees with respect to a horizontal axis within the thermal transfer component 12.

Typically, the carbon fibers included in the carbon fiber composite that comprises the thermally conductive frame 12a have a diameter from about 8 to about 20 microns and a length from about 100 to about 400 millimeters. The carbon fibers are generally impregnated with an epoxy organic polymer resin or other cross-linking organic polymer resin when fabricating the thermally conductive frame 12a. Alternative organic polymer resins are not, however, excluded when fabricating the thermally conductive frame 12a.

The thermally conductive plug 12c that is aligned to and assembled into the aperture 12b through the thermally conductive frame 12a and covered by the spring 12d may in general comprise any of several types of thermally conductive materials such as but not limited to thermally conductive metals and thermally conductive composites. However, the thermally conductive plug 12c preferably comprises an isotropically thermally conductive material under circumstances where the thermally conductive frame 12a comprises an anisotropic thermally conductive material. Such an isotropic thermally conductive material does not directionally limit thermal transfer through the thermally conductive plug 12c. Typically and preferably, the thermally conductive plug 12c comprises a metal isotropically thermally conductive material. While any of several metals may be selected for fabricating the thermally conductive plug 12c, the metal isotropically thermally conductive plug 12c preferably comprises a copper, copper alloy, aluminum or aluminum alloy metal. Typically and preferably, the metal isotropically thermally conductive plug 12c has a thickness greater than the thickness of the thermally conductive frame 12a, and typically from about 0.200 to about 0.500 inches, so that the metal isotropically thermally conductive plug 12c may be freely compressed against the heat generating component 10c by the spring 12d.

The spring 12d that covers the thermally conductive plug 12c and also covers a portion of the thermally conductive frame 12a may, similarly with other components within the exploded schematic perspective-view diagram of FIG. 1, be formed of any of several spring materials that are otherwise generally conventional within the circuit board design, fabrication and assembly art, and also functional within the context of the thermal transfer component 12 of FIG. 1. With regard to such functionality, the spring 12d is intended to be selected of a spring material having a composition and dimensions that provide appropriate downward compression of the thermally conductive plug 12c with respect to a heat generating component 10c located and assembled at a location upon the circuit board substrate 10a beneath the aperture 12b.

Thus, the spring 12d may comprise any of several spring materials, including but not limited to metallic spring materials and composite spring materials. Typically and preferably, the spring 12d comprises a stainless steel or iron alloy based spring material. Typically and preferably, the spring 12d has a thickness from about 0.010 to about 0.060 inches, a length (in a horizontal axis) from about 1 to about 10 inches and a width (in a vertical axis) from about 1 to about 6 inches, to compress the thermally conductive plug 12c against the heat generating component 10c.

Typically and preferably, the spring 12d is assembled to the thermally conductive frame 12a using conventional methods and materials, such as but not limited to screws, rivets, glue and/or alternative attachment methods and materials.

The spacers 12e typically also comprise an isotropically thermally conductive material of similar composition as the thermally conductive plug 12c. Thus, the spacers 12e typically comprise a metal isotropically thermally conductive material, such as but not limited to a copper, copper alloy, aluminum or aluminum alloy isotropically thermally conductive material. Typically, each of the spacers 12e is designed and fabricated with dimensions and shapes intended to provide a flat assembly surface when assembling the circuit board 10, the thermal transfer component 12 and the wedge-lock assemblies 14 while using the fasteners 16.

The wedge-lock assemblies 14 that in conjunction with the fasteners 16 assist in assembling the thermal transfer component 12 and the circuit board 10 may comprise any of several wedge-lock assemblies that are otherwise generally conventional in the circuit board design, fabrication and assembly art. Commonly, but not exclusively, the wedge-lock assemblies comprise wedge-shaped sub-components assembled in a vertical direction, which when drawn to each other by a lineal contracting force will offset and cause an increase in effective cross-sectional area of the wedge-lock assemblies 14. Typically and preferably, the wedge-lock assemblies 14 comprise a metal material, such as but not limited to an aluminum or aluminum alloy material, that has a thickness from about 0.100 to about 0.400 inches that is uniquely sized and/or uniquely shaped to fit a gap between: (1) an assemblage of the circuit board 10, the thermal transfer component 12 and the wedge-lock assemblies 14; and (2) a slot within a circuit board chassis that will be illustrated in further detail below.

Finally, the fasteners 16 may comprise any of several types of fasteners that functionally provide for attachment of the circuit board 10, the thermal transfer component 12 and the wedge-lock assemblies 14. Although appropriately sized screws may provide a most common fastener component, the embodiments are not intended to be so limited. Rather, alternative mechanical locking type fasteners are also not excluded.

Figures 2, 3:
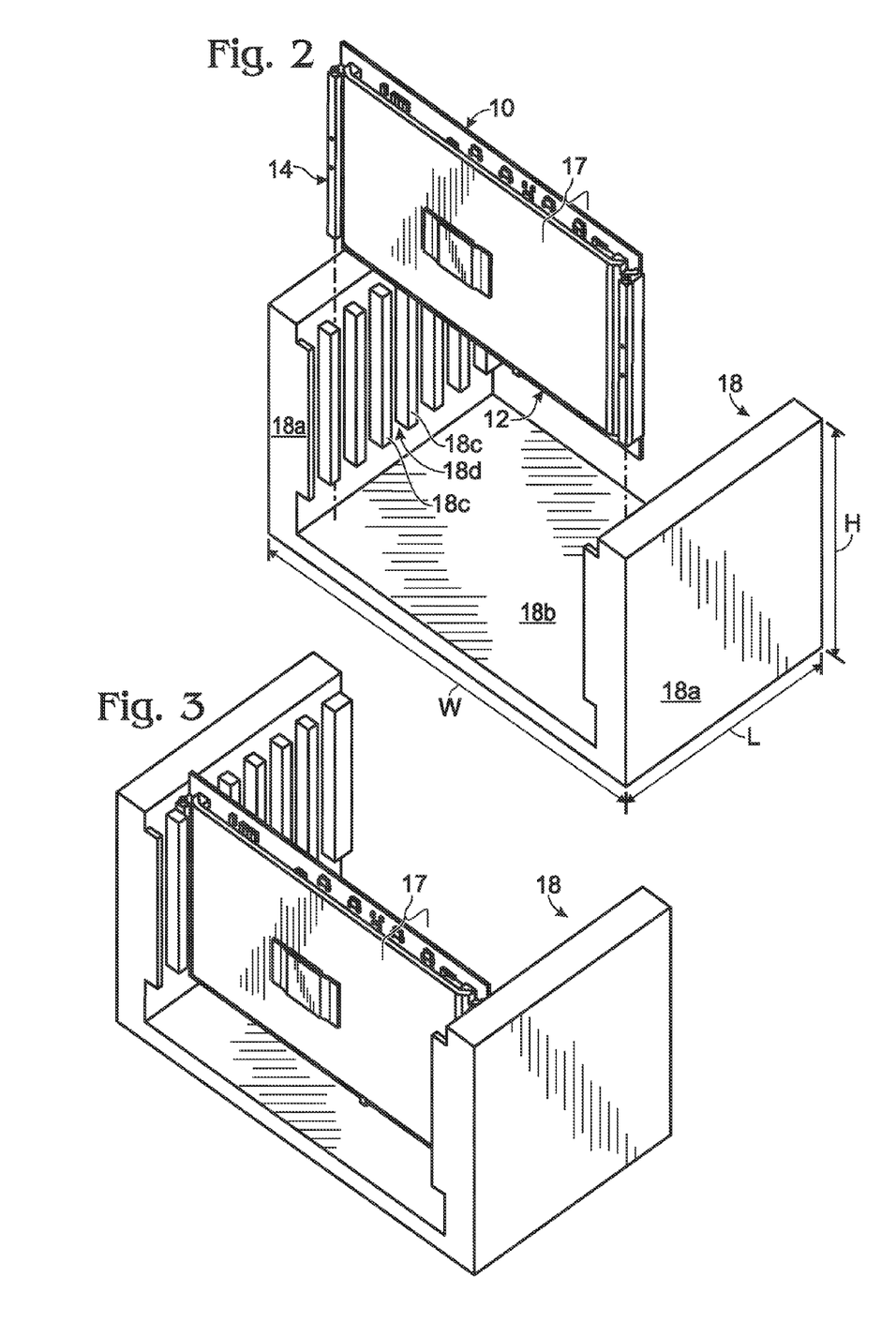
FIG. 2 and FIG. 3 show schematic perspective-view diagrams of the circuit board, the thermal transfer component and the wedge-lock assemblies in accordance with FIG. 1 that are mutually assembled rather than exploded, and in an aggregate further assembled into a circuit board chassis.

FIG. 2 and FIG. 3 first show the results of assembling the circuit board 10, the thermal transfer component 12 and the wedge-lock assemblies 14 together as a singular unit by use of the fasteners 16, to provide in an aggregate a thermal dissipation enhanced circuit board 17.

FIG. 2 and FIG. 3 also show the results of assembling the thermal dissipation enhanced circuit board 17 that comprises the circuit board 10, the thermal transfer component 12 and the wedge-lock assemblies 14 together by use of the fasteners 16 into a circuit board chassis 18. As is illustrated within the schematic perspective-view diagrams of FIG. 2 and FIG. 3, the circuit board chassis 18 includes a plurality of opposing sidewall portions 18a that are separated by and connected to a base portion 18b. As is further illustrated in-part within the schematic perspective-view diagrams of FIG. 2 and FIG. 3, and also in-part further implicit within FIG. 2 and FIG. 3, each of the sidewall portions 18a of the circuit board chassis 18 includes on an interior thereof a plurality of ribs 18c that define interposed there between a plurality of slots 18d that in-turn are intended to accommodate the thermal dissipation enhanced circuit board 17.

The circuit board chassis 18 may comprise any of several materials from which a circuit board chassis is generally fabricated and constructed. Typically, such materials will include conductor materials and more particularly metal or metal alloy conductor materials, whose selection criteria often relate primarily to structural and weight support limitations within the context of cost constraints. Iron, iron alloy, stainless steel, stainless steel alloys, aluminum and aluminum alloys, as well as other alloys that need not necessarily be selected for cost considerations, are particularly common. For weight savings considerations, titanium containing alloys may also merit consideration, as might thermally conducting structural composites. Typically and preferably, the circuit board chassis 18 is sized appropriately so that the circuit board 10 and the thermal transfer component 12 are both accommodated within the circuit board chassis 18 when mutually assembled into the circuit board chassis 18 with the mechanical assistance of the wedge-lock assemblies 14.

A typical sizing of the circuit board chassis 18 provides for a length L as illustrated in FIG. 2 from about 3 to about 18 inches, a width W as illustrated in FIG. 2 from about 5 to about 20 inches and a height H as illustrated in FIG. 2 from about 8 to about 20 inches.

Figure 4:
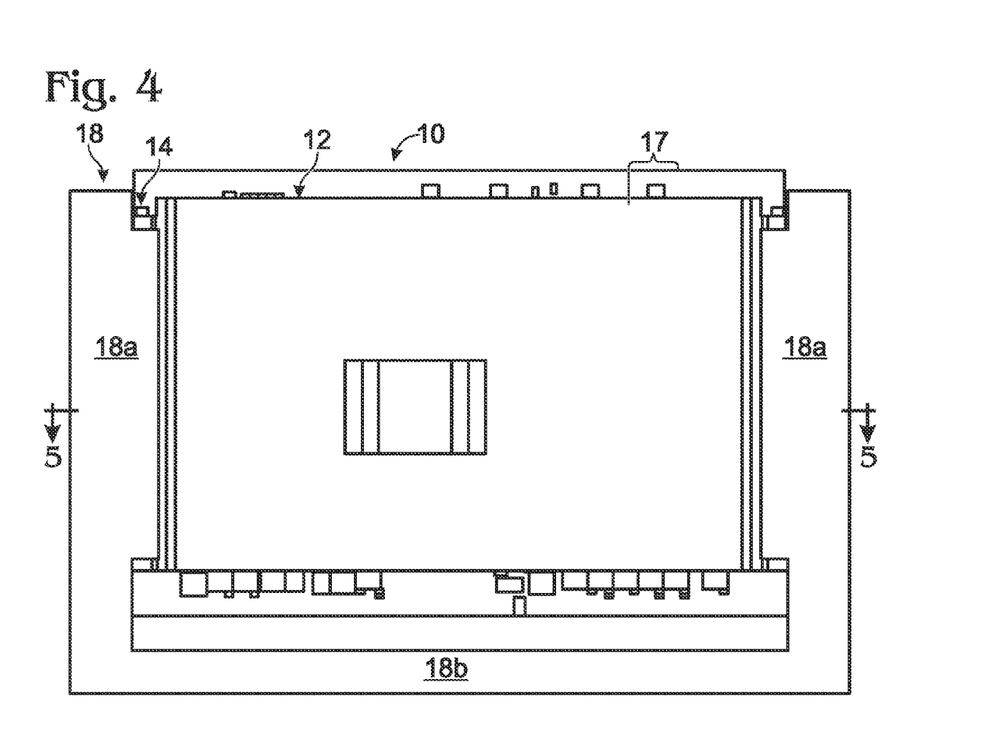
FIG. 4 shows a schematic end-view diagram of the circuit board, the thermal transfer component and the wedge-lock assemblies that are mutually assembled in accordance with FIG. 2 and FIG. 3, and further assembled into the circuit board chassis in accordance with FIG. 2 and FIG. 3.

FIG. 4 shows a schematic end-view diagram of the circuit board chassis 18 including the thermal dissipation enhanced circuit board 17 that comprises the circuit board 10, the thermal transfer component 12 and the wedge-lock assemblies 14 fastened together using the fasteners 16, as illustrated in FIG. 3. As is further illustrated within the schematic end-view diagram of FIG. 4, the thermal transfer component 12 is sized somewhat smaller than the circuit board 10, and thus upper and lower portions of the circuit board substrate 10a, including portions of electrical components 10b, are visible in the foregoing end-view.

Figure 5:
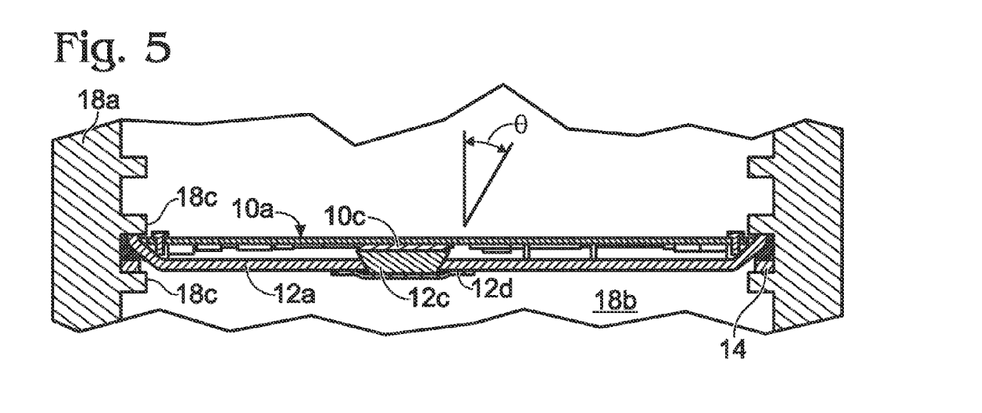
FIG. 5 shows a schematic cross-sectional diagram of the circuit board, the thermal transfer component and the wedge-lock assemblies mutually assembled and further assembled into the circuit board chassis, derived from the schematic end-view diagram of FIG. 4.

FIG. 5 shows a schematic cross-sectional diagram of the circuit board chassis 18 including the thermal dissipation enhanced circuit board 17 assembled therein, whose schematic end-view diagram is illustrated in FIG. 4.

FIG. 5 shows the sidewalls 18a and base 18b of the circuit board chassis 18. FIG. 5 also shows the circuit board substrate 10a, the heat generating component 10c located and assembled to the circuit board substrate 10a, the thermally conductive plug 12c located and assembled within the aperture 12b within the thermally conductive frame 12a and further compressed against the heat generating component 10c by the spring 12d.

As is illustrated within FIG. 5, the circuit board substrate 10a and the thermally conductive frame 12a are mutually aligned at a chassis assembly location for the circuit board substrate 10a and for the mutually aligned thermally conductive frame 12a, and wedged into a slot interposed between a pair of ribs 18d within opposite sidewalls 18a of the circuit board chassis 18 by assistance of the wedge-lock assemblies 14.

As is further illustrated within the schematic cross-sectional diagram of FIG. 5, the aperture 12b into which is located and assembled the thermally conductive plug 12c, as well as the thermally conductive plug 12c itself, are each preferably formed with a sidewall taper angle θ (theta) from about 5 to about 60 degrees with respect to a normal to the thermally conductive frame 12a (or the circuit board substrate 10a). Such a taper angle provides for a more effective and uniform sidewall contact between the thermally conductive plug 12c and the thermally conductive frame 12a.

As is also noticeable within the schematic cross-sectional diagram of FIG. 5, the thermally conductive plug 12c provides only top surface thermal contact to the heat generating component 10c absent any sidewall contact or clamping of either of the thermally conductive frame 12a or the thermally conductive plug 12c with respect to the heat generating component 10c (i.e., there is no sidewall clamp assembled to a sidewall of the heat generating component 10c).

As is further understood by a person skilled in the art, when operating the circuit board 10 that is illustrated in FIG. 1, the heat generating component 10c generates heat. The heat is first transferred to the thermally conductive plug 10c, which if comprised of copper has a thermal conductivity of about 400 watts per meter-degree K which is isotropic in all directions. The heat is then efficiently transferred at the tapered sidewalls of the thermally conductive plug 12c to the thermally conductive frame 12a, which if formed of an aligned carbon fiber composite material has a thermal conductivity of about 800 watts per meter-degree Kelvin which is anisotropic in a direction that preferably spans to the circuit board chassis 18 sidewalls 18a. Thus, a thermal transfer component 12 in accordance with the embodiments (which is intended to include the thermally conductive frame 12a and the thermally conductive plug 12c but not the circuit board chassis 18 or the circuit board 10) or a thermal transfer apparatus in accordance with the embodiments (which is intended to include the circuit board chassis 18, the thermal conductive frame 12a and the thermally conductive plug 12c but not the circuit board 10), provides an efficient heat transfer from a heat generating component 10c upon any of several types of electronics substrates, to a circuit board chassis.

As is qualitatively understood by a person skilled in the art, when the heat generating component 10c that is illustrated in FIG. 5 is powered, the heat generating component 10c generates heat whose dissipation is needed in order to avoiding overheating of the heat generating component 10c and compromise of operation of the circuits included within the circuit board 10. The heat generated by the heat generating component 10c is first transferred isotropically through the thermally conductive plug 12c, which due to the tapered interface with the aperture 12b within the thermally conductive frame 12a provides for enhanced thermal transfer to the thermally conductive frame 12a. Insofar as the thermally conductive frame 12a comprises preferably longitudinally aligned thermally conductive fibers, such as but not limited to thermally conductive carbon fibers, in the direction interposed between the sidewalls 18a of the circuit board chassis 18, the heat generated by the heat generating component 10c and initially transferred through the thermally conductive plug 12c efficiently transfers longitudinally through the thermally conductive frame 12a to the sidewalls 18a of the circuit board chassis 18, where the transferred heat is efficiently dissipated to the environment.

As is further understood by a person skilled in the art, while the illustrative embodiment of the invention as illustrated in FIG. 5 most particularly illustrates the invention within the context of a circuit board 10 including a heat generating component 10c located and assembled thereto whose thermal output is thermally transferred through the thermally conductive plug 12c and the thermally conductive frame 12a to the circuit board chassis 18, the embodiments are not in general intended to be so limited. Rather the embodiments are also intended to encompass additional embodiments that include thermal transfer from heat generating components located and assembled upon substrates other than circuit boards. Such substrates other than circuit boards may include, but are not necessarily limited to, ceramic substrates, glass substrates and glass-ceramic substrates.

The foregoing embodiments are illustrative of the invention rather than limiting of the invention. Revisions and modifications may be made to methods, materials, structures and dimensions of a heat transfer component, a heat transfer apparatus or a method for cooling a heat generating component in accordance with the foregoing embodiments, while still providing a heat transfer component, a heat transfer apparatus or a related method for cooling a heat generating component in accordance with the invention, further in accordance with the accompanying claims.

What is claimed is:

1. A thermal transfer component comprising:
   a thermally conductive frame sized to fit a substrate, the thermally conductive frame including an aperture completely through the thermally conductive frame at a location of a heat generating component located upon the substrate when the thermally conductive frame and the substrate are mutually aligned and assembled;
   a tapered thermally conductive plug comprising a first side and a second side located in the aperture, the first side having a smaller surface area than a second side wherein the first and second sides are parallel, the second side contacting contacting the heat generating component to provide a thermal connection between the thermally conductive frame and the heat generating component when the thermally conductive frame and the substrate are mutually aligned and assembled; and
   a planar-shaped spring contacting at least a portion of said first side of said thermally conductive plug.

2. The thermal transfer component of claim 1 wherein:
   the thermally conductive frame comprises a thermally conductive material that conducts heat anisotropically; and
   the thermally conductive plug comprises a thermally conductive material that conducts heat isotropically.

3. The thermal transfer component of claim 2 wherein:
   the thermally conductive frame comprises an aligned conductive fiber composite; and
   the thermally conductive plug comprises a metal.

4. The thermal transfer component of claim 3 wherein:
   the thermally conductive frame comprises an aligned carbon conductive fiber composite; and
   the thermally conductive plug comprises copper.

5. The thermal transfer component of claim 1 further comprising a spring located upon the thermally conductive plug and bridging to the thermally conductive frame, the spring compressing the thermally conductive plug against the heat generating component when the thermally conductive frame and the substrate are mutually aligned and assembled.

6. The thermal transfer component of claim 1 where the thermally conductive plug contacts the heat generating component absent sidewall clamping of the heat generating component.

7. A thermal transfer apparatus comprising:
   a chassis sized to fit a substrate that includes a heat generating component;
   a thermally conductive frame also fitted to the chassis, the thermally conductive frame including an aperture completely through the thermally conductive frame at a location of the heat generating component when the thermally conductive frame and the substrate are mutually aligned and assembled to the chassis;
   a tapered thermally conductive plug comprising a first side and a second side located in the aperture, the first side having a smaller surface area than a second side wherein the first and second sides are parallel, the second side contacting contacting the heat generating component to provide a thermal connection between the thermally conductive frame and the heat generating component when the thermally conductive frame and the substrate are mutually aligned and assembled to the chassis; and a planar-shaped spring contacting at least a portion of said first side of said thermally conductive plug.

8. The thermal transfer apparatus of claim 7 wherein:
the thermally conductive frame comprises a thermally conductive material that conducts heat anisotropically; and
the thermally conductive plug comprises a thermally conductive material that conducts heat isotropically.

9. The thermal transfer apparatus of claim 8 wherein:
the thermally conductive frame comprises an aligned conductive fiber composite; and
the thermally conductive plug comprises a metal.

10. The thermal transfer apparatus of claim 9 wherein:
the thermally conductive frame comprises an aligned carbon conductive fiber composite; and
the thermally conductive plug comprises copper.

11. The thermal transfer apparatus of claim 7 further comprising a spring covering the thermally conductive plug and bridging to the thermally conductive frame, the spring compressing the thermally conductive plug against the heat generating component when the thermally conductive frame and the substrate are mutually aligned and assembled to the chassis.

12. The thermal transfer apparatus of claim 7 wherein the aperture through the thermally conductive frame has a tapered sidewall.

13. The thermal transfer apparatus of claim 12 wherein a taper of the tapered sidewall is from about 5 to about 60 degrees with respect to a normal to the thermally conductive frame to provide the aperture that is wider at the side of the thermally conductive frame nearer the heat generating component.

14. The thermal transfer apparatus of claim 7 wherein the thermally conductive plug contacts the heat generating component absent sidewall clamping of the heat generating component.

15. A method for cooling a heat generating component comprising:
assembling to a substrate that includes a heat generating component to form a thermal transfer component that includes:
a thermally conductive frame including an aperture completely through the thermally conductive frame at a location of the heat generating component when the thermally conductive frame and the substrate are aligned; and
a tapered thermally conductive plug comprising a first side and a second side located within the aperture, the first side having a smaller surface area than a second side wherein the first and second sides are parallel, the second side contacting contacting the heat generating component, and a planar-shaped spring contacting at least a portion of said first side of said thermally conductive plug; and
powering the heat generating component to generate heat that is dissipated through the thermally conductive plug and the thermally conductive frame.

16. The method of claim 15 further comprising assembling the substrate and the thermal transfer component into a chassis wherein the powering the heat generating component dissipates the heat into the chassis.

17. The method of claim 15 wherein:
the heat is transferred isotropically through the thermally conductive plug; and
the heat is transferred anisotropically through the thermally conductive frame.

18. The method of claim 15 wherein the thermally conductive plug aligns with and contacts the heat generating component absent sidewall clamping of the heat generating component.

19. The thermal transfer component of claim 1 wherein the thermally conductive frame and the substrate are mutually aligned at a chassis assembly location of the thermally conductive frame and the substrate.

20. The thermal transfer apparatus of claim 7 wherein the thermally conductive frame and the substrate are mutually aligned at a chassis assembly location of the thermally conductive frame and the substrate.

21. The method of claim 15 wherein the thermally conductive frame and the substrate are mutually aligned at a chassis assembly location of the thermally conductive frame and the substrate.

22. A thermal transfer component comprising:
a thermally conductive frame comprising an anisotropic thermal transfer material and including an aperture completely through the thermally conductive frame at a location of a heat generating component located upon a substrate when the thermally conductive frame and the substrate are assembled;
a tapered thermally conductive plug comprising an isotropic thermal transfer material and a first side and a second side, and located in the aperture, the first side having a smaller surface area than a second side wherein the first and second sides are parallel, the second side contacting contacting the heat generating component to provide a thermal connection between the thermally conductive frame and the heat generating component when the thermally conductive frame and the substrate are assembled; and
a planar-shaped spring contacting at least a portion of said first side of said thermally conductive plug.

23. The thermal transfer component of claim 1, wherein the thermally conductive frame further comprises four edges, and thermally conductive fibers that are parallel to one another and to two of the four edges and are orthogonal to the other two edges.

24. The thermal transfer apparatus of claim 7, wherein the thermally conductive frame further comprises four edges, and thermally conductive fibers that are parallel to one another and to two of the four edges and are orthogonal to the other two edges.

25. The method of claim 15, wherein the thermally conductive frame further comprises four edges, and thermally conductive fibers that are parallel to one another and to two of the four edges and are orthogonal to the other two edges.

26. The thermal transfer component of claim 22, wherein the thermally conductive frame further comprises four edges, and thermally conductive fibers that are parallel to one another and to two of the four edges and are orthogonal to the other two edges.

* * * * *